US008729897B2

(12) United States Patent
Porter (10) Patent No.: US 8,729,897 B2
(45) Date of Patent: May 20, 2014

(54) METHOD AND MAGNETIC RESONANCE APPARATUS FOR DYNAMIC PHASE CORRECTION IN A MULTI CHANNEL RF TRANSMISSION

(75) Inventor: David Andrew Porter, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 370 days.

(21) Appl. No.: 13/196,135

(22) Filed: Aug. 2, 2011

(65) Prior Publication Data

US 2012/0025825 A1 Feb. 2, 2012

(30) Foreign Application Priority Data

Aug. 2, 2010 (DE) .......................... 10 2010 038 775

(51) Int. Cl.
*G01V 3/00* (2006.01)
(52) U.S. Cl.
USPC ........................................................ 324/309
(58) Field of Classification Search
USPC ................................................ 324/300–322
See application file for complete search history.

(56) References Cited

U.S. PATENT DOCUMENTS

| 6,265,873 | B1 * | 7/2001 | Le Roux | 324/309 |
|---|---|---|---|---|
| 6,275,036 | B1 * | 8/2001 | van Yperen et al. | 324/307 |
| 6,842,000 | B2 * | 1/2005 | Norris et al. | 324/309 |
| 6,856,132 | B2 * | 2/2005 | Appel et al. | 324/303 |
| 6,882,150 | B2 | 4/2005 | Jenniskens et al. | |
| 6,965,233 | B2 * | 11/2005 | Le Roux | 324/309 |
| 7,205,763 | B2 * | 4/2007 | Porter | 324/306 |
| 7,944,206 | B2 * | 5/2011 | Frydman et al. | 324/307 |
| 8,169,218 | B2 * | 5/2012 | Nezafat et al. | 324/309 |
| 8,406,849 | B2 * | 3/2013 | Jeong et al. | 600/410 |
| 8,513,945 | B2 * | 8/2013 | Kim et al. | 324/309 |
| 2010/0286500 | A1 | 11/2010 | Ruhm | |

OTHER PUBLICATIONS

Zhu, "Parallel Excitation With an Array of Transmit Coils", in: Magnetic Resonance in Medicine, vol. 51, (2004) pp. 775-784.
Liu et al., "Self-Navigated Interleaved Spiral (SNAILS): Application to High-Resolution Diffusion Tensor Imaging", Magnetic Resonance in Medicine, (2004) pp. 1388-1396.
Weih et al., "Online Motion Correction for Diffusion-Weighted Segmented-EPI and FLASH Imaging", MAGMA 16, (2004) pp. 277-283.
Xu et al., "Designing Multichannel, Multidimensional, Arbitrary Flip Angle RF Pulses Using an Optimal Control Approach", Magnetic Resonance in Medicine 59, (2008) pp. 547-560.
Miller et al., "Nonlinear Phase Correction for Navigated Diffusion Imaging", Magn. Reson. Med. 50, (2003) pp. 343-353.

(Continued)

*Primary Examiner* — Dixomara Vargas
(74) *Attorney, Agent, or Firm* — Schiff Hardin LLP (57) ABSTRACT

In a method and magnetic resonance (MR) apparatus to acquire spin echo-based MR signals of an examination subject with a multi-spin echo sequence with multiple refocusing pulses after a single excitation pulse in an MR system that has a multichannel RF transmission and reception module: detect a spatial, two-dimensional phase distribution in the examination subject is detected by acquiring navigator signals, a phase and amplitude distribution for the individual transmission channels of the RF transmission and reception module is calculated to generate a magnetic field B1 for one of the RF refocusing pulses to generate the spin echo-based MR signal under consideration of the spatial phase distribution of the navigator signals, and this RF refocusing pulse is radiated via the multichannel RF transmission and reception module with the calculated phase and amplitude distributions of the individual transmission channels.

10 Claims, 4 Drawing Sheets

(56) References Cited

OTHER PUBLICATIONS

Pipe et al., "Multishot Diffusion-Weighted FSE Using PROPELLER MRI", Magn. Reson Med. 47, (2002), pp. 42-52.
Wang et al., "PROPELLER EPI: An MRI Technique Suitable for Diffusion Tensor Imaging at High Field Strength With Reduced Geometric Distortions", Magn. Reson. Med. 54, (2005) pp. 1232-1240.
Atkinson et al., "Nonlinear Phase Correction for Navigated Multi-Coil Diffusion Images", Magn. Reson. Med. 56, (2006) pp. 1135-1139.
Porter et al., "High Resolution Diffusion Weighted Imaging Using Readout Segmented Echo-Planar Imaging, Parallel Imaging and a Two-Dimensional Navigator-Based Re-Acquisition", Magn. Reson. Med. 62, (2009) pp. 468-475.
Bastin et al., "Application of Non-CPMG Fast-Spin-Echo Sequences to MR Diffusion Imaging", Proc. Intl Soc. Magn. Reson. Med., (2001) p. 1549.
Alsop, "Phase Insensitive Preparation of Single-Shot RARE: Application to Diffusion Imaging in Humans", Magn. Reson. Med. 38, (1997) pp. 527-533.
Schick, "SPLICE: Sub-Second Diffusion-Sensitive MR Imaging Using a Modified Fast Spin-Echo Acquisition", Magn. Reson. Med. 38, (1997) pp. 638-644.
Norris et al., "Online Motion Correction for Diffusion-Weighted Imaging Using Navigator Echoes: Application to RARE Imaging Without Sensitivity Loss", Magn. Reson. Med. 45, (2001) pp. 729-733.
Zhu et al., "Improving Flip Angle Uniformity With Parallel Excitation", Proc. Int. Soc. Magn. Reson. Med. 13, (2005) p. 2752.
Collins et al., "Combination of Optimized Transmit Arrays and Some Receive Array Reconstruction Methods Can Yield Homogeneous Images at Very High Frequencies", Magn. Reson. Med. 54, (2005) pp. 1327-1332.
Feinberg, "GRASE (Gradient-and Spin-Echo) MR Imaging: A New Fast Clinical Imaging Technique", Radiology 181, (1991) pp. 597-602.
Wong et al., "Single Slab High Resolution 3D Whole Brain Imaging Using Spiral FSE", Proc. Jnt. Soc. Magn. Reson. Med. 8, (2000) p. 683.
Cunningham et al., "Saturated Double-Angle Method for Rapid B1+ Mapping", Magn. Reson. Med. 55, (2006) pp. 1326-1333.
"3D diffusion tensor imaging with 2D navigated turbo spin echo," von Mengershausen et al., MAGMA, Magnetic Resonance Materials in Physics, Biology and Medicine, vol. 18 (2005), pp. 206-216.
"A Novel Fast Split-Echo Multi-Shot Diffusion-Weighted MRI Method Using Navigator Echoes," Williams et al., Magnetic Resonance in Medicine, vol. 41 (1999), pp. 734-742.
"High-Resolution Diffusion Imaging Using a Radial Turbo-Spin-Echo Sequence: Implementation, Eddy Current Compensation, and Self-Navigation," Seifert et al., Journal of Magnetic Resonance, vol. 144 (2000), pp. 243-254.

\* cited by examiner

FIG 4

METHOD AND MAGNETIC RESONANCE APPARATUS FOR DYNAMIC PHASE CORRECTION IN A MULTI CHANNEL RF TRANSMISSION

BACKGROUND OF THE INVENTION

1. Field of the Invention

The present invention concerns a method to acquire spin echo-based magnetic resonance (MR) signals of an examination subject with a multi-spin echo sequence in which multiple refocusing pulses are radiated after each RF excitation pulse, and an MR system for implementing such a method.

2. Description of the Prior Art

Figure 1:
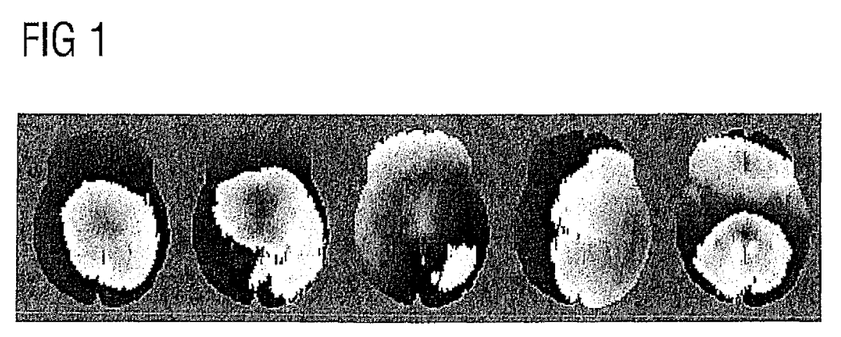
FIG. 1 shows phase images of a single-shot, diffusion-weighted spin echo echoplanar imaging sequence without correction according to the invention.

Magnetic resonance diffusion-weighted imaging of the brain with multiple echoes per excitation is very sensitive to spatially variant, non-linear phase errors. These errors are caused, among other things, by the pulsing cerebrospinal fluid (CSF) of the brain that occurs upon switching of the diffusion-weighted gradients (Miller K L, Pauly J P. Nonlinear phase correction for navigated diffusion imaging. Magn. Reson. Med. 2003; 50:343-353). For example, phase images of a single-shot, diffusion-weighted echoplanar imaging sequence are shown in FIG. 1 herein, wherein it can be seen that the phase curve across the image changes from exposure-to-exposure. This leads to severe image artifacts in sequences with multiple excitations and/or multiple refocusing pulses for each image in the event that no correction is made.

Multiple imaging sequences with a repeat excitation were developed in which a correction of these non-linear phase errors is implemented afterwards (Pipe J G, Farthing V G, Forbes K P. Multishot diffusion-weighted FSE using PROPELLER MRI. Magn. Reson. Med. 2002; 47:42-52; Liu C, Bammer R, Kim D, Moseley M E. Self-navigated interleaved spiral (SNAILS): application to high-resolution diffusion tensor imaging. Magn. Reson. Med. 2004; 52:1388-1396; Wang F-N, Huang T-Y, Lin F-H, Chuang T-C, Chen N-K, Chung H-W, Chen C-Y, Kwong K K. PROPELLER EPI: an MRI technique suitable for diffusion tensor imaging at high field strength with reduced geometric distortions. Magn. Reson. Med. 2005; 54:1232-1240; Atkinson D, Counsell S, Hajnal J V, Batchelor P G, Hill D L, Larkman D J. Nonlinear phase correction of navigated multi-coil diffusion images. Magn. Reson. Med. 2006; 56:1135-1139; Porter D A, Heidemann R. High Resolution Diffusion Weighted Imaging Using Readout-Segmented Echo-Planar Imaging, Parallel Imaging and a Two-Dimensional Navigator-Based Re-Acquisition. Magn. Reson. Med. 2009; 62:468-475). These sequences, however, impose limitations in the signal readout of the detected MR signal.

The difficulties in fast spin echo sequences (turbo spin echo sequence, TSE, or fast spin echo (FSE), namely in the readout of the signals during a train of 180° refocusing pulses, are particularly significant. This type of imaging sequence is attractive in the clinical routine since no susceptibility artifacts (which increasingly arise in other methods) occur. In this case an additional difficulty is that phase errors occur due to the random phase difference between the 90° excitation pulse and the 180° excitation pulse. This means that the Carr-Purcell-Meiboom-Gill (CMPG) condition, which is necessary in order to stabilize the amplitude and phase of the signal train of the spin echo, is not satisfied. A few techniques are known that remedy this problem of the fast spin echo sequences by cyclically switching the radiation direction of the refocusing pulses (Pipe J G, Farthing V G, Forbes K P. Multishot diffusion-weighted FSE using PROPELLER MRI. Magn. Reson. Med. 2002; 47:42-52; Bastin M E, Le Roux P. Application of non-CPMG fast-spin-echo sequences to MR diffusion imaging. Proc. Intl. Soc. Magn. Reson. Med. 2001; 9:1549), or by using stimulated echoes in order to avoid the phase variation (Alsop D C. Phase insensitive preparation of single-shot RARE: application to diffusion imaging in humans. Magn. Reson. Med. 1997; 38:527-533; SPLICE: sub-second diffusion-sensitive MR imaging using a modified fast spin-echo acquisition. Schick F. Magn. Reson. Med. 1997; 38:638-644). However, the cyclical change of the radiation axis does not stabilize the echo train in all cases, and a signal reduction results given the use of the stimulated echo. In Norris D G, Driesel W. Online motion correction for diffusion-weighted imaging using navigator echoes: Application to RARE imaging without sensitivity loss. Magn. Reson. Med. 2001; 45:729-733, a prospective (or predictive) correction of linear phase errors is described in which data of a navigator signal are used to switch a gradient before the data acquisition. This method was used in the original with a 1D navigator technique in order to correct a linear phase error along one spatial direction, In Weih K S, Driesel W, von Mengershausen M, Norris D G. Online motion correction for diffusion-weighted segmented EPI and FLASH imaging. MAGMA 2004; 16:277-283, orthogonal navigator signals were used in order to correct k-space shifts in two dimensions.

A number of RF transmission channels were used in order to control the spatial distribution of a $B_1$ amplitude of an RF excitation pulse and the phase of the excitation pulse in order to achieve an improved homogeneity in the image (Zhu Y. Parallel excitation with an array of transmit coils. Magn. Reson. Med. 2004; 51:775-784; Zhu Y, Giaquinto R. Improving flip angle uniformity with parallel excitation. Proc. Int. Soc. Magn. Reson. Med. 2005; 13:2752; Collins C M, Liu W, Swift B J, Smith M B. Combination of optimized transmit arrays and some receive array reconstruction methods can yield homogeneous images at very high frequencies. Magn. Reson. Med. 2005; 54:1327-1332).

SUMMARY OF THE INVENTION

An object of the present invention is to improve the acquisition of fast spin echo sequences such that phase-induced errors are minimized.

According to a first aspect of the invention, a method is provided to acquire spin echo-based MR signals of an examination subject with a multi-spin echo sequence with multiple refocusing pulses after an excitation pulse in an MR system, wherein this MR system has a multichannel transmission and reception module. The method according to the invention includes the following steps: detect a spatial, two-dimensional phase distribution in the examination subject by acquiring navigator signals; and subsequently calculate a phase and amplitude distribution for the individual transmission channels of the RF transmission and reception module to generate a magnetic field $B_1$ for one of the RF refocusing pulses with which the spin echo-based MR signal is generated, under consideration of the spatial phase distribution of the navigation signals. Furthermore, this RF refocusing pulse is radiated by the transmission channels of the RF transmission and reception module with the calculated phase and amplitude distributions of the individual transmission channels. By the calculation of the phase and amplitude distributions of the individual transmission channels before the radiation of the refocusing pulse, it is possible that all refocusing pulses occur along a predetermined axis in a reference system rotating with the Larmor frequency. The phase errors thus can be corrected. The multi-spin echo sequence is preferably a diffusion-weighted imaging sequence, wherein 2D navigator signals are detected after switching (activation) of the additional diffusion gradients and before the readout of the first spin echo signal. The calculation of the phase and amplitude distributions for the individual transmission channels is implemented after the switching of the diffusion gradients and before the signal readout, such that the refocusing pulse (the radiation of which generates the first spin echo signal is generated that is then read out) can be radiated with the calculated spatial phase and amplitude distributions.

The phase distribution of the individual transmission channels is advantageously calculated such that the CPMG condition is satisfied. The CPMG condition is satisfied when the exposure pulse is radiated along an axis y' in a reference system rotating along with the Larmor frequency, and the subsequent refocusing pulses are radiated perpendicular thereto along the x' axis. All spin echoes are refocused along the x' axis with an amplitude that is independent of local $B_0$ field inhomogeneities. In a Carr-Purcell-Meiboom-Gill sequence of the invention, three refocusing pulses are used before the readout of the first spin echo, wherein the phase and amplitude distribution of the $B_1$ field of the third refocusing pulse that is responsible for the generation of the first detected signal echo is calculated such that the first spin echo is detected along a fixed axis (x', for example) perpendicular to the basic magnetic field (along which the first refocusing pulse was also radiated) in a coordinate system rotating along with the Larmor frequency. It is possible to use the standard signal readout for fast spin echo sequences (FSE) in the data acquisition. According to this aspect of the invention, the phase of the third RF refocusing pulse is set such that the first spin echo acquisition along this axis x' is refocused in the entire examination subject. This means that, for a voxel, the phases of all spin echo signals are identical and the phases do not change between the excitations in a multi-shot sequence. This means that the phase is controlled between excitation and refocusing pulses such that this remains constant. The signal phase then satisfies the CPMG condition, and all subsequent refocusing pulses are radiated along this axis x', and the spin echoes resulting from this likewise lie along this axis x'.

The effect of the second refocusing pulse that was radiated with a fixed phase along this axis x' is advantageously taken into account in the calculation of the phase and amplitude distribution of the $B_1$ field for the third refocusing pulse. This refocusing pulse rotates the magnetization along this x' axis and consequently changes the phase.

The connection between the spatial phase distribution of the navigator signals that is detected in each reception channel, and the radiated RF excitation pulse, is taken into account in the calculation of the phase and amplitude distribution in the individual transmission channels. For example, this can be achieved using reference data of a non-diffusion-weighted imaging method in which acquired data do not have any movement-induced phases.

For example, the navigator signals can be generated with the use of the echoplanar technique. The associated raw data space can likewise be acquired in a spiral pattern.

To radiate the RF refocusing pulse, the individual transmission channels are adjusted with the calculated phase and amplitude distributions to generate the $B_1$ field before the RF refocusing pulse is ultimately radiated with the calculated phases.

Since it is a multi-echo sequence, additional refocusing pulses to detect additional signal echoes are radiated after the third refocusing pulse.

To cause the MR spin echo signals to occur along the x' axis, the method described above can also be combined with a method in which the occurrence of the spin echo signals along a fixed axis is controlled by the selection of the shape of additional magnetic field gradients. This is described in detail in Norris D G, Driesel W. Online motion correction for diffusion-weighted imaging using navigator echoes: Application to RARE imaging without sensitivity loss. Magn. Reson. Med. 2001; 45:729-733 and Weih K S, Driesel W, von Mengershausen M, Norris D G. Online motion correction for diffusion-weighted segmented EPI and FLASH imaging. MAGMA 2004; 16:277-283. The additional magnetic field gradients could be switched before or after the refocusing pulse R3.

The invention furthermore concerns an MR system with which the aforementioned method can be executed that has a multichannel RF transmission and reception module to transmit the excitation and refocusing pulses. In addition to the typical units—such as gradient control unit and image sequence control unit—a computer is provided that calculates the phase and amplitude distribution of the individual transmission channels to generate the B1 field for the RF refocusing pulse that takes the spatial phase distribution of the navigation signals into account in the calculation in order to achieve that all spins of the examined subject have the signal echo along the predetermined axis, such that the phase in a voxel is constant and equal.

DESCRIPTION OF THE PREFERRED EMBODIMENTS

As is apparent in FIG. 1, the phase variation is rough both between the individually acquired images and respectively in an image. The phase that is shown in greyscale values in the image likewise varies just as in an individual image.

Figure 2:
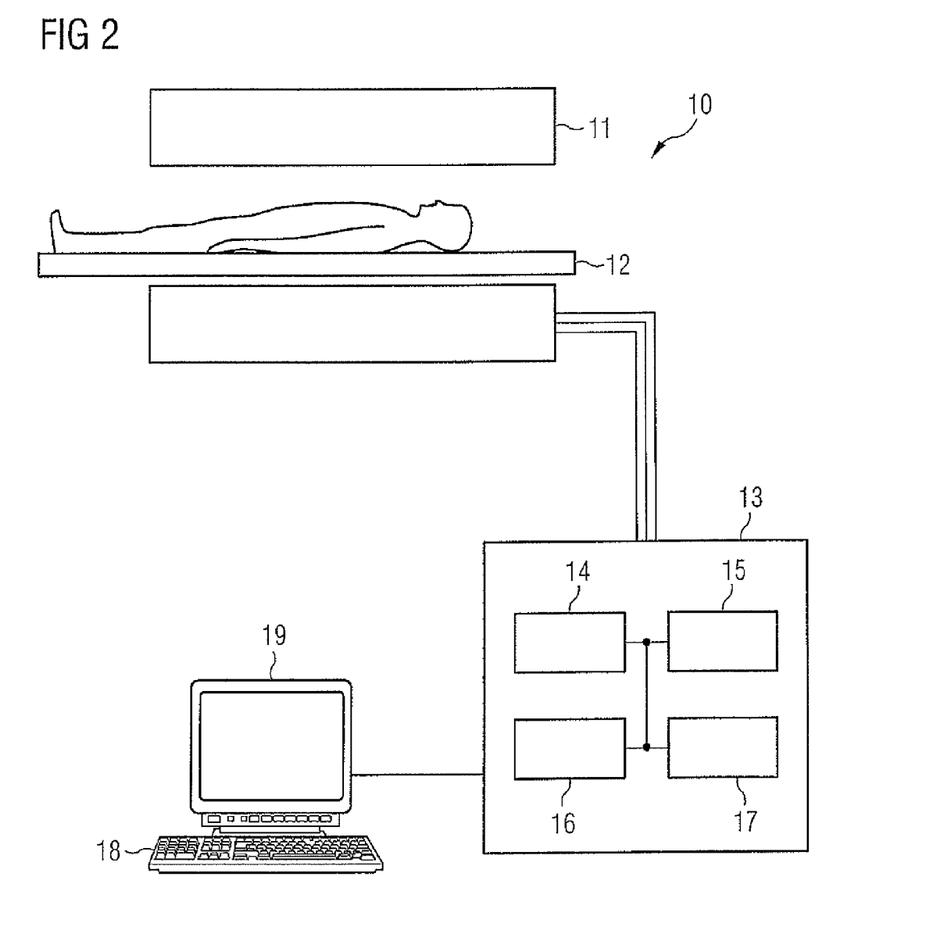
FIG. 2 schematically illustrates an MR system with which the phase can be dynamically corrected according to the invention.

An MR system with which the method according to the invention can be implemented is shown in FIG. 2. The MR system 10 has a magnet 11 to generate a polarization field $B_0$. An examination subject arranged on a bed 12 is driven into the magnet, and the magnetization resulting in the body is presented with spatial resolution in MR images via radiation of gradients and radio-frequency pulses and the detection of MR signals. How an MR system is designed and how MR images (for example diffusion-weighted MR images) can generally be generated with it is known in general to those skilled in the art and thus need not be described in detail herein. The MR system furthermore has a central control unit 13 with a multichannel RE transmission and reception module 14 in which the excitation pulses and RF refocusing pulses are generated.

A gradient control unit 15 controls the switching of the gradients depending on the selected imaging sequence. An image sequence controller 16 controls the acquisition workflow with switching of the RF pulses, the gradients and the signal acquisition, depending on the selected imaging sequence. A computer 17 calculates a phase amplitude distribution for the different channels of the multichannel RE transmission device with the aid of the acquired phase distribution of navigator signals. Furthermore, an input device 18 to operate the MR system and a monitor 19 to view the acquired MR images and to view the settings of the MR system are provided.

Figure 3:
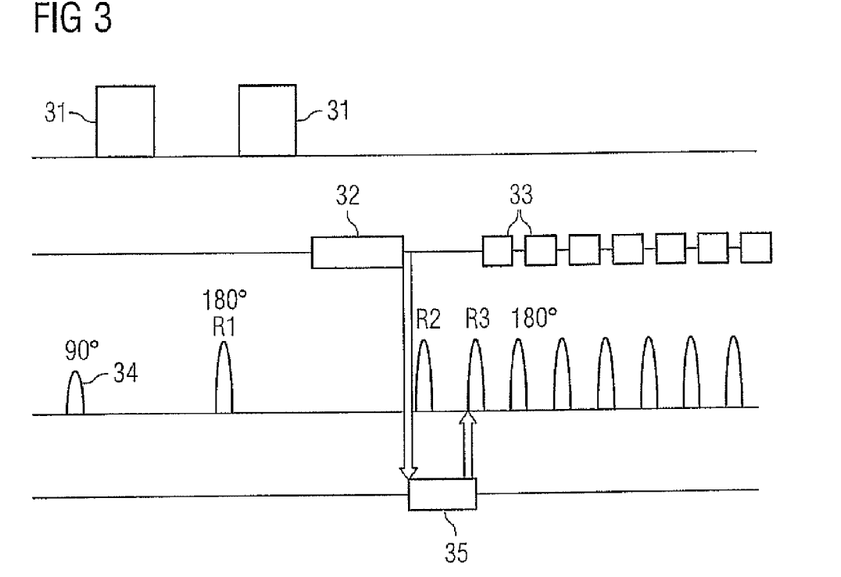
FIG. 3 is a sequence diagram of the method according to the invention, in which the calculation of the amplitude and phase distribution takes place during the imaging sequence.

In FIG. 3 a sequence diagram is shown that can be used in a diffusion-weighted imaging in the phase correction according to the present invention. According to the invention, the phase correction does not occur via post-processing after the signal acquisition; rather, in the implementation of the sequence before the signal acquisition the spatially system-dependent phase influence is determined and accounted for in the radiation of RF refocusing pulses, such that the system-dependent phase expansion is corrected. In the shown imaging sequence the diffusion gradients 31 that are typical in a first diffusion-weighted imaging sequence are shown in the first line. A diffusion weighting along the direction in which the gradients are switched is achieved via these diffusion gradients. The gradients can be switched individually or in combination in each of the three spatial directions. The signal readout is shown in the second line, wherein a two-dimensional navigator signal with which the spatial phase distribution can be determined at the end of the diffusion preparation is read out in a readout window 32. Different acquisition strategies can be used to acquire the 2D navigator signals; for example, the echoplanar technique or techniques with spiral-patterned acquisition of k-space can be used. The navigator signal is formed by a single spin echo, wherein the resolution can be lower than or the same as given diffusion-weighted imaging. The resolution must be high enough to determine the spatial frequencies of the spatial phase changes.

Furthermore, shown in the second line is the individual readout windows 33 of the spin echo signals that are induced by the RF excitation pulse chain with a 90° excitation pulse 34, three first refocusing pulses R1 through R3 and additional 180° pulses. Each of the spin echo signals is typically detected in a single k-space line under a fixed readout gradient, as is the case in a typical fast spin echo sequence. In another embodiment, multiple parallel phase coding lines $K_y$ can also be acquired with the aid of the GRASE method (as described in "Grase (gradient and spin echo) MR Imaging: A New Fast Clinical Imaging technique" Feinberg et al., Radiology, vol. 181 (1991), United States patent practice. 597-602). The use of spiral-patterned acquisition techniques is likewise possible. The signal readout can take place with the use of the propeller technique, for example as is described in reference 2. Given this technique a train of spin echoes is likewise used, wherein the x and y coordinate axes are next rotated by an excitation. This method is less sensitive to movements of the examination subject; however, the acquisition time is longer. The boxes 35 shown in line 4 represent the calculation in which the properties of the multiple RF transmission channels are determined with the aid of the navigator signals detected in the data acquisition 32. According to the invention, the phase and amplitude curve of each channel of the multichannel RF transmission and reception module is calculated. The properties of the transmission channels for the subsequent refocusing pulses, i.e. for the refocusing pulse R3 and possibly the following RF refocusing pulses, are calculated in this time window (shown with 35). The pulse R3 is calculated dynamically; the subsequent pulses maintain the CPMG condition with the use of a predetermined amplitude and phase. If it is not possible to achieve the necessary phases and amplitudes for R3, it can also be necessary to calculate the RF pulses according to R3. The calculation of phase and amplitude ratios of the third refocusing pulse R3 thereby takes place such that the first spin echo acquisition (which is designated with R1) takes place along an x' axis in a rotating reference system, such that the first spin echo signal is refocused along this axis x'. The signal phase then satisfies the CPMG condition, and all subsequent refocusing pulses are radiated along this axis x' (see FIG. 4), wherein the echoes induced by these pulses are also refocused along this axis x'.

Figure 4:
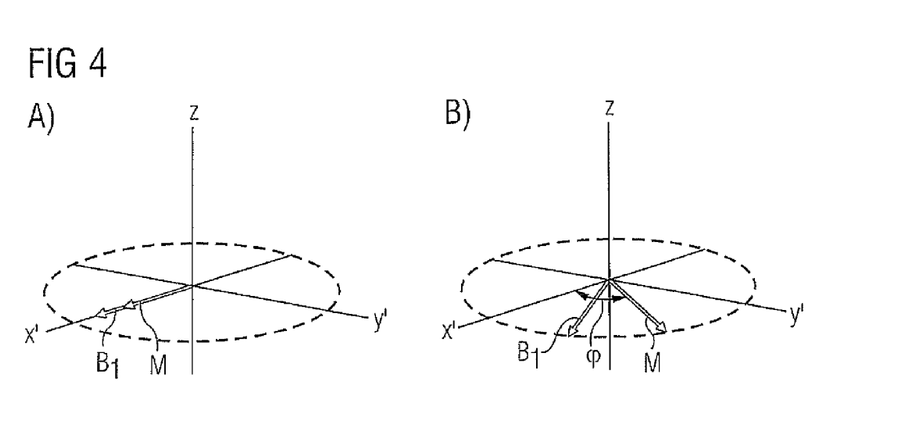
FIG. 4 schematically illustrates a vector diagram with the depiction of the direction of the magnetization and of the radiated $B_1$ field.

How the phase of the local magnetic field $B_1$ for the pulse R3 can be used in order to align the magnetization along the x' axis when the magnetization has some random phase is shown in detail in FIG. 4. The applied $B_1$ field of a refocusing pulse and the resulting magnetization are shown in a rotating reference system in FIG. 4, wherein the rotating reference system rotates around the basic magnetic field direction z with the Larmor frequency. The shown magnetization corresponds to the orientation of the magnetization at the beginning of the RF excitation pulse. FIG A shows the standard CPMG case in which both M and $B_1$ are aligned along the x' axis. After an 180° pulse, M is still aligned along x'. In the example shown in FIG B, the magnetization has an angle φ relative to the x' axis. $B_1$ is radiated at an angle of φ/2 relative to the x' axis. Graphically, this leads to a mirroring of the magnetization at the radiated a-field, such that the magnetization lies along x' after the 180° pulse. With the navigator signals, the signal phase φ is now calculated (as shown in FIG B) and the phase and amplitude distribution is calculated for the individual transmission channels so that the radiated RF field has a $B_1$ component as it is shown in FIG. 4B, namely such that the 180° pulse produces a variation of the attitude of the magnetization M on the x' axis.

The effect of the second refocusing pulse R2 that is radiated with a fixed phase relative to the x' axis must hereby be taken into account in the calculation. The magnetization is mirrored on the x' axis, and the phase is changed accordingly. The maximum time between the navigator signal and the pulse R3 is achieved via R2. This time is required in order to process the navigator signals and calculate the phase of R3. If R2 were not to be used, the time period between the middle of the navigator signal and the pulse R3 would repeat after the pulse R3, before the spin echo E1 is formed. Without R2, the first spin echo would occur after a time period that corresponds to the time span from R1 to R3. This time span is shortened to the time span between R2 and R3 by radiating R2. Only given very short processing times for the calculation and control of the pulse R3 could R2 also be omitted. The 90° excitation pulse 34 and the first refocusing pulse R1 are radiated with a phase position as it is known from the standard CPMG imaging sequence; namely the 90° excitation pulse is radiated along y' and the first refocusing pulse R1 is radiated along x'.

Furthermore, in the calculation the connection between the measured phase in the navigator signals in each reception channel and the radiated transmission field should be known. This connection could have been determined beforehand with the use of reference measurements by acquiring non-diffusion-weighted data in which no movement-induced phase changes occur.

The amplitude shape of the multiple transmission channels can be calculated with methods known from the prior art ("Designing Multichannel, Multidimensional, Arbitrary Flip Angle RF Pulses Using an Optimal Control Approach," Xu et al., Magnetic Resonance in Medicine, Vol. 59 (2008) United States patent practice. 547-560). However, the phase amplitude response should be calculated in the short time window that is shown with 35 in FIG. 3, wherein this time window is approximately 20 ms long. Calculations also known from the aforementioned Xu et al. article, for example, can be used given larger flip angles such as the 180° refocusing pulses.

For the described correction method the $B_1$ field should have a uniform amplitude across the examination region, such that the spatial distribution of the $B_1$ amplitude must also be taken into account when the RF waveform is calculated for the different RF channels. In the present case the local $B_1$ amplitude is a static property that is not affected by the movement during the diffusion-sensitive gradients. Calibration data of a $B_1$ field presentation can therefore be used before the start of the diffusion-weighted imaging (as described in "Saturated Double-Angle Method for Rapid B1+ Imaging," Cunningham et al. Magnetic Resonance in Medicine," Vol. 55, (2006) United States patent practice 1326-1333).

Figure 5:
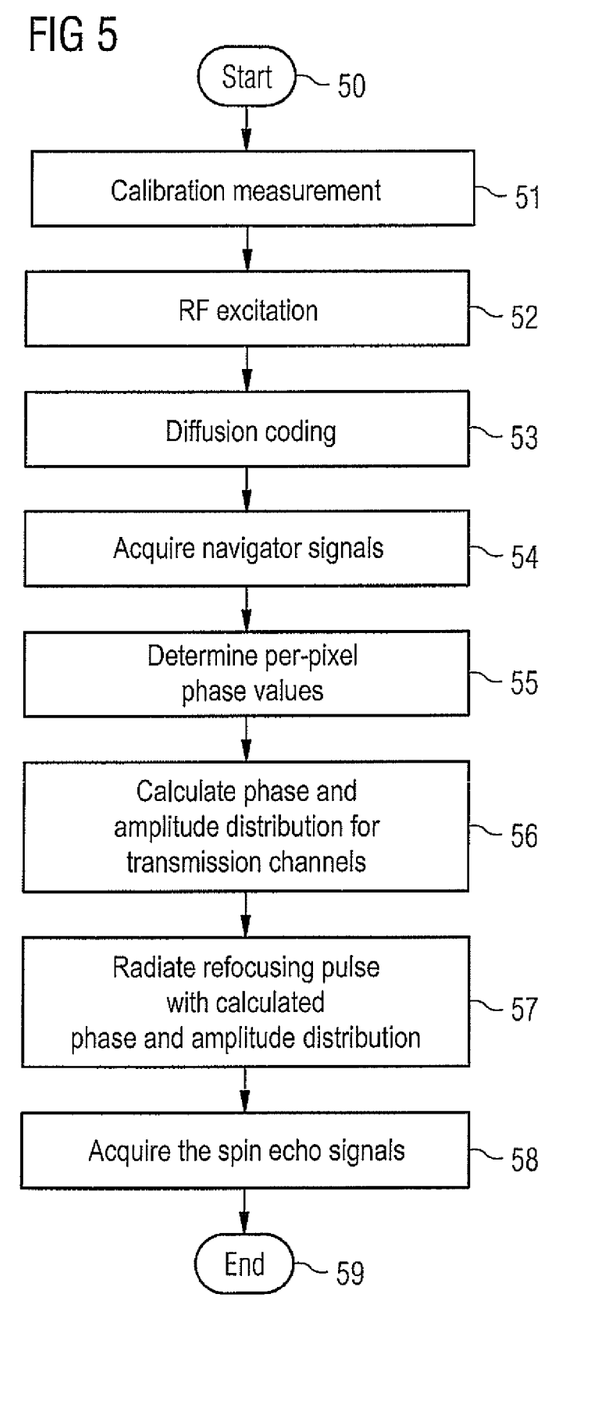
FIG. 5 is a flowchart to acquire a diffusion-weighted imaging sequence without phase errors in accordance with the invention.

The method according to the invention is summarized in FIG. 5. The method starts in Step 50. The calibration measurement to show the variation of the $B_1$ field amplitude and the determination of the phase connection between transmission system and reception system subsequently ensue before the start of the diffusion-weighted measurement. The RF excitation with RF pulse 34 takes place in Step 52 after these calibration measurements in Step 51. The optional diffusion coding with switching of the diffusion gradients takes place in Step 53. The navigator signals are acquired in Step 54, as shown in FIG. 3.

In the next step 55 a phase value for each pixel in a two-dimensional navigator image is determined during the diffusion-weighted imaging. With the aid of the calibration data in Step 51 and the phase values determined per pixel from Step 55 it is possible to calculate the amplitude and phase distribution for the individual RF transmission channels in Step 56. The phase and amplitude response calculated in Step 56 for each RF transmission channel should lead to a resulting $B_1$ field (as is shown in FIG. 4B, for example), such that the magnetization likewise refocuses along x' given the signal echo. In Step 57 the refocusing pulse R3 is radiated with the calculated phases and amplitude values before the spin echo-based MR signals are acquired in Step 58. The method ends in Step 59.

In summary, the present invention enables the acquisition of multi-spin echo sequences without interfering phase errors in diffusion-weighted exposures.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire spin echo-based magnetic resonance (MR) signals from an examination subject situated in an MR data acquisition unit, which comprises a radio-frequency (RF) module having a plurality of RF transmission channels that also respectively form a plurality of RF reception channels, said method comprising:
   operating the MR data acquisition unit to detect a two-dimensional spatial phase distribution in the examination subject by acquiring navigator signals via said plurality of RF reception channels;
   in a processor, calculating a phase and amplitude distribution, dependent on the spatial phase distribution of said navigator signals, for the plurality of RF transmission channels, that gives on refocusing pulse, among multiple RF refocusing pulses radiated in a multi-spin echo sequence following a single RF excitation pulse, a magnetic field that causes all spin-echo based MR signals detected in said multi-spin echo sequence to be detected along a same predetermined coordinate axis; and
   operating said MR data acquisition unit according to said multi-spin echo sequence by radiating said one RF refocusing pulse via said plurality of RF transmission channels with the calculated phase and amplitude distribution of the plurality of RF transmission channels, and detecting said spin echo-based MR signals via said plurality of RF reception channels, and making the detected spin echo-based MR signals available in electronic form at an output of said RF module.

2. A method as claimed in claim 1 comprising in said multi-spin echo sequence, activating diffusion gradients to give said spin echo-based MR signals diffusion-weighting, and detecting said navigator signal after activating said diffusion gradients and before readout of a first of said spin echo-based MR signals.

3. A method as claimed in claim 1 comprising employing a Carr-Purcell-Meiboom-Gill sequence as said multi-spin echo sequence comprising three refocusing pulses before readout of a first of said spin echo-based MR signals, with a phase and amplitude distribution of the magnetic field of a third of said refocusing pulses being calculated to cause said first spin echo-based MR signal to be detected along an axis that is perpendicular to a basic magnetic field of said MR data acquisition unit in a coordinate system that rotates with the Larmor frequency, and radiating a first of said RF refocusing pulses along said axis.

4. A method as claimed in claim 3 comprising radiating a second of said refocusing pulses with a fixed phase along said axis and using said second of said refocusing pulses to calculate said phase and amplitude distribution of said magnetic field of said third of said refocusing pulses.

5. A method as claimed in claim 1 comprising detecting a relationship between the spatial phase distribution of the navigator signals in each reception channel of said multi-channel RF transmission and reception module, and the radiated RF excitation pulse, and using said relationship in calculating said phase and amplitude distribution of the individual transmission channels.

6. A method as claimed in claim 1 comprising generating said navigator signals with an echoplanar technique.

7. A method as claimed in claim 1 comprising radiating said one of said RF refocusing pulses by adjusting said individual transmission channels with the calculated phase and amplitude distribution to generate said magnetic field to give said one of said RF refocusing pulses said magnetic field.

8. A method as claimed in claim 1 comprising radiating additional refocusing pulses in said sequence perpendicular to a basic magnetic field in said MR data acquisition unit after acquiring a first of said echo-based magnetic resonance signals along said predetermined axis.

9. A method as claimed in claim 1 comprising selecting a shape of magnetic field gradients activated in said sequence to cause the spin echo-based MR signals to occur along said predetermined coordinate axis.

10. a magnetic resonance (MR) apparatus comprising:
    an MR data acquisition unit adapted to receive an examination subject therein, said MR data acquisition unit comprising a radio-frequency (RF) module having a plurality of RF transmission channels that also respectively form a plurality of RF reception channels;

a control unit configured to operate the MR data acquisition unit to detect a two-dimensional spatial phase distribution in the examination subject by acquiring navigator signals via said plurality of RF reception channels;

said control unit being configured to calculate a phase and amplitude distribution, dependent on the spatial phase distribution of said navigator signals, for the plurality of RF transmission channels, that gives on refocusing pulse, among multiple RF refocusing pulses radiated in a multi-spin echo sequence following a single RF excitation pulse, a magnetic field that causes all spin-echo based MR signals detected in said multi-spin echo sequence to be detected along a same predetermined coordinate axis; and said control unit being configured to operate said MR data acquisition unit according to said multi-spin echo sequence by radiating said one RF refocusing pulse via said plurality of RF transmission channels with the calculated phase and amplitude distribution of the plurality of RF transmission channels, and detecting said spin echo-based MR signals via said plurality of RF reception channels, and to make the detected spin echo-based MR signals available in electronic form at an output of said RF module.

* * * * *